US009614222B2

(12) United States Patent
Kawada

(10) Patent No.: US 9,614,222 B2
(45) Date of Patent: Apr. 4, 2017

(54) NEGATIVE ELECTRODE MATERIAL FOR SECONDARY BATTERY HAVING LITHIUM-DOPED SILICON-SILICON OXIDE COMPOSITE, METHOD FOR MANUFACTURING NEGATIVE ELECTRODE, AND LITHIUM SECONDARY BATTERY

(71) Applicant: SHIN-ETSU CHEMICAL CO., LTD., Tokyo (JP)

(72) Inventor: Nobuo Kawada, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 207 days.

(21) Appl. No.: 14/481,521

(22) Filed: Sep. 9, 2014

(65) Prior Publication Data

US 2014/0377456 A1    Dec. 25, 2014

Related U.S. Application Data

(62) Division of application No. 13/052,732, filed on Mar. 21, 2011, now Pat. No. 8,889,294.

(30) Foreign Application Priority Data

Apr. 5, 2010  (JP) ................. 2010-086922

(51) Int. Cl.
| H01M 2/16 | (2006.01) |
| H01M 4/48 | (2010.01) |
| C23C 16/26 | (2006.01) |
| C23C 16/44 | (2006.01) |
| H01M 4/134 | (2010.01) |
| H01M 10/052 | (2010.01) |
| H01M 4/36 | (2006.01) |

(52) U.S. Cl.
CPC ............ *H01M 4/48* (2013.01); *C23C 16/26* (2013.01); *C23C 16/4417* (2013.01); *H01M 4/134* (2013.01); *H01M 4/366* (2013.01); *H01M 10/052* (2013.01); *Y02E 60/122* (2013.01); *Y02T 10/7011* (2013.01)

(58) Field of Classification Search
CPC .. C23C 16/26; C23C 16/4417; H01M 10/052; H01M 4/134; H01M 4/366; H01M 4/48; Y02E 60/122; Y02T 10/7011
See application file for complete search history.

(56) References Cited

U.S. PATENT DOCUMENTS

| 5,395,711 | A |  | 3/1995 | Tahara et al. |
| 5,567,539 | A |  | 10/1996 | Takahashi et al. |
| 5,707,756 | A |  | 1/1998 | Inoue et al. |
| 7,037,581 | B2 |  | 5/2006 | Aramata et al. |
| 2002/0006550 | A1 |  | 1/2002 | Yang et al. |
| 2002/0102462 | A1 |  | 8/2002 | Huggins et al. |
| 2003/0053945 | A1 |  | 3/2003 | Fukuoka et al. |
| 2003/0206852 | A1 |  | 11/2003 | Yang et al. |
| 2003/0215711 | A1 |  | 11/2003 | Aramata et al. |
| 2005/0130043 | A1 |  | 6/2005 | Gao et al. |
| 2006/0068287 | A1 | * | 3/2006 | Morita ............ H01M 4/134 429/223 |
| 2007/0224508 | A1 |  | 9/2007 | Aramata et al. |
| 2007/0224509 | A1 | * | 9/2007 | Aramata ............ H01M 4/131 429/231.95 |
| 2008/0070120 | A1 |  | 3/2008 | Miyawaki et al. |
| 2008/0286652 | A1 | * | 11/2008 | Nazri ............... H01M 4/38 429/217 |
| 2010/0203391 | A1 |  | 8/2010 | Lopatin et al. |
| 2011/0111304 | A1 |  | 5/2011 | Cui et al. |

FOREIGN PATENT DOCUMENTS

| CN | 1307374 A | 8/2001 |
| CN | 1794494 A | 6/2006 |
| CN | 101047234 A | 10/2007 |
| CN | 101145621 A | 3/2008 |
| JP | A-08-102331 | 4/1996 |
| JP | A-08-130011 | 5/1996 |
| JP | A-08-130036 | 5/1996 |
| JP | B2-2997741 | 11/2000 |
| JP | A-2002-042806 | 2/2002 |
| JP | A-2003-160328 | 6/2003 |
| JP | B2-3952180 | 8/2007 |
| JP | A-2007-294423 | 11/2007 |

OTHER PUBLICATIONS

European Office Action dated Nov. 13, 2014 issued in European Patent Application No. 11 002 386.8.
(Continued)

*Primary Examiner* — Patrick Ryan
*Assistant Examiner* — Ben Lewis
(74) *Attorney, Agent, or Firm* — Oliff PLC

(57) ABSTRACT

The present invention is a negative electrode material for a secondary battery with a non-aqueous electrolyte comprising at least a silicon-silicon oxide composite and a carbon coating formed on a surface of the silicon-silicon oxide composite, wherein at least the silicon-silicon oxide composite is doped with lithium, and a ratio I(SiC)/I(Si) of a peak intensity I(SiC) attributable to SiC of $2\theta=35.8\pm0.2°$ to a peak intensity I(Si) attributable to Si of $2\theta=28.4\pm0.2°$ satisfies a relation of $I(SiC)/I(Si)\leq 0.03$, when x-ray diffraction using Cu-K$\alpha$ ray. As a result, there is provided a negative electrode material for a secondary battery with a non-aqueous electrolyte that is superior in first efficiency and cycle durability to a conventional negative electrode material.

16 Claims, 3 Drawing Sheets

(56) References Cited

OTHER PUBLICATIONS

Jan. 4, 2015 Office Action issued in Chinese Application No. 201110085975.5.
European Search Report issued in Application No. 11 00 2386.8; Dated Jul. 21, 2011.
Oct. 5, 2012 Office Action issued in European Patent Application No. 11 002 386.8.
Chinese Office Action dated Jul. 2, 2014 issued in Chinese Application No. 201110085975.5 (with partial translation).
Aug. 20, 2013 Office Action issued in U.S. Appl. No. 13/052,732.
Dec. 16, 2013 Office Action issued in U.S. Appl. No. 13/052,732.
Apr. 15, 2014 Office Action issued in U.S. Appl. No. 13/052,732.

\* cited by examiner

NEGATIVE ELECTRODE MATERIAL FOR SECONDARY BATTERY HAVING LITHIUM-DOPED SILICON-SILICON OXIDE COMPOSITE, METHOD FOR MANUFACTURING NEGATIVE ELECTRODE, AND LITHIUM SECONDARY BATTERY

This is a Division of application Ser. No. 13/052,732 filed Mar. 21, 2011, which claims the benefit of Japanese Application No. 2010-06922 filed Apr. 5, 2010. The disclosure of the prior applications is hereby incorporated by reference herein in its entirety.

BACKGROUND OF THE INVENTION

Field of the Invention

The present invention relates to a negative electrode material for a secondary battery with a non-aqueous electrolyte, such as a lithium ion secondary battery, to a method for manufacturing the same, and to a lithium ion secondary battery by using the same, and the material is composed of a silicon-silicon oxide-lithium composite useful for the negative electrode material for a secondary battery with a non-aqueous electrolyte.

Description of the Related Art

Currently lithium ion secondary batteries are widely used for mobile electronic devices, such as a mobile phone, a laptop computer, and the like, because of high energy density. In recent years, with increasing awareness of environmental issues, an attempt to use this lithium ion secondary battery as a power source for an electric automobile, which is an environmentally-friendly automobile, has become active.

However, the performance of a current lithium ion secondary battery is insufficient for application to the electric automobile in terms of capacity and cycle durability. There has been accordingly advanced development of a next generation model of the lithium ion secondary battery that has high capacity and is superior in cycle durability.

As one problem of the development of the next generation model of the lithium ion secondary battery, improvement in the performance of a negative electrode material is pointed out.

Currently carbon negative electrode materials are widely used. The development by using a material other than carbon has also advanced to sharply enhance the performance, and a representative thereof is silicon oxide.

The silicon oxide has several times as much theoretical capacity as carbon has, and there is thereby possibility that silicon oxide becomes an excellent negative electrode material.

There were, however, problems such as low first efficiency, low electronic conductivity, and low cycle durability at the beginning of the development, and various improvements have accordingly made so far.

Here, the "first efficiency" means a ratio of discharge capacity to charge capacity in the first charge/discharge. As a result of the low first efficiency, the energy density of the lithium ion secondary battery decreases. It is considered that the low first efficiency of silicon oxide is caused by generating a lot of lithium compounds that do not contribute to the charge/discharge at the first charge.

As a method to solve this, there has been known a method of generating the above-described lithium compounds by making silicon oxide and lithium metal or a lithium compound (lithium oxide, lithium hydroxide, lithium hydride, organolithium, and the like) react in advance, before the first charge.

For example, Patent Literature 1 discloses use of a silicon oxide that can occlude and release lithium ions as a negative electrode active material, and a negative electrode material that satisfies a relation of x>0 and 2>y>0 wherein a ratio of the number of atoms among silicon, lithium, and oxygen contained in the silicon oxide is represented by 1:x:y.

As a method for manufacturing the above-described silicon oxide that is represented by a compositional formula of $Li_xSiO_y$ and contains lithium, there is disclosed a method in which a suboxide of silicon $SiO_y$ that does not contain lithium is synthesized in advance, and lithium ions are occluded by an electrochemical reaction between the obtained suboxide of silicon $SiO_y$ and lithium or a substance containing lithium. In addition, there is disclosed a method in which a simple substance of each of lithium and silicon, or a compound thereof are blended at a predetermined molar ratio, and it is heated under a non-oxidizing atmosphere or an oxygen-regulated atmosphere to synthesize.

It describes that as a starting raw material, each of oxides and hydroxides, salts such as carbonates and nitrates, organolithiums, or the like are exemplified, and although it is normally possible to synthesize at a heating temperature of 400° C. or more, a temperature of 400 to 800° C. is preferable, since a disproportionation reaction to silicon and silicon dioxide may occur at a temperature of 800° C. or more.

Moreover, Patent Literatures 2 to 4 describe that a chemical method or an electrochemical method is used as a method for preliminarily inserting lithium before storing the negative electrode active material in a battery container.

It describes that as the chemical method, a method of making the negative electrode active material directly react with lithium metal, a lithium alloy (lithium-aluminum alloy and the like), or a lithium compound (n-butyllithium, lithium hydride, lithium aluminum hydride, or the like), and a lithium insertion reaction is preferably performed at a temperature of 25 to 80° C. in the chemical method. Moreover, it discloses, as the electrochemical method, a method of discharging, at open system, oxidation reduction system in which the above-described negative electrode active material is used for a positive electrode active material and a non-aqueous electrolyte containing lithium metal, a lithium alloy, or a lithium salt is used for a negative electrode active material, and a method of charging oxidation reduction system that is composed of a non-aqueous electrolyte that contains a transition metal oxide containing lithium, the negative electrode active material, and a lithium salt, as the positive electrode active material.

Moreover, Patent Literature 5 discloses powder of silicon oxide containing lithium represented by a general formula of $SiLi_xO_y$, in which the ranges of x and y are 0<x<1.0 and 0<y<1.5, lithium is fused, and a part of the fused lithium is crystallized. It also discloses a method for manufacturing the powder of the silicon oxide containing lithium, in which a blend of raw material powder that generates SiO gas and metallic lithium or a lithium compound is made to react by heating under an inert gas atmosphere or under reduced pressure at a temperature of 800 to 1300° C.

It discloses that, at that time, silicon oxide ($SiO_z$) powder (0<z<2) and silicon dioxide powder can be used as the raw material powder that generates SiO gas, and it is used after adding reduction powder (metallic silicon compounds, and powder containing carbon) as needed. It also discloses that the metallic lithium and the lithium compounds are not restricted in particular, and as the lithium compounds, for example, lithium oxide, lithium hydroxide, lithium carbonate, lithium nitrate, lithium silicate, hydrates thereof, or the like can be used, other than the metallic lithium.

On the other hand, when electronic conductivity is low, the capacity of the lithium ion secondary battery under high load decreases, and particularly cycle durability decreases.

For improvement to enhance this electronic conductivity, Patent Literature 6 discloses a negative electrode material having an electronic conductive material layer formed on a surface of silicon oxide particles. It describes that the silicon oxide among them is silicon oxide having an elementary composition of Si and O, and is preferably a suboxide of silicon represented by $SiO_x$ (0<x<2), and that it can be lithium silicate in which silicon oxide is doped with Li. It also describes that a carbon material is preferably used for a conductive material and it can be manufactured by using a CVD method, a liquid phase method, or a sintering method.

Moreover, as one improving method to enhance the cycle durability, that is, to suppress an occurrence of a decrease in the capacity even when charge/discharge are repeated, Patent Literature 7 discloses a conductive silicon composite in which a diffraction peak attributable to Si (111) is observed when x-ray diffraction, the size of silicon crystal obtained by the Scherrer method based on the half-width of a diffraction line thereof is 1 to 500 nm, and a surface of its particle is coated with carbon, the composite having a structure that crystallites of silicon are dispersed to a silicon compound, particularly, the conductive silicon composite in which the silicon compound is silicon dioxide and at least a part of the surface thereof is adhered to carbon.

There is an example of a method for manufacturing this composite in which silicon oxide is subjected to disproportionation with an organic gas and/or vapor at a temperature of 900 to 1400° C., and carbon is deposited by chemical vapor deposition treatment.

Moreover, for improvement in both of the first efficiency and cycle durability, Patent Literature 8 discloses a silicon-silicon oxide composite doped with lithium, the composite having a structure that silicon particles having a size of 0.5 to 50 nm are dispersed to silicon oxide in an atomic order and/or a crystallite state, particularly, a conductive silicon-silicon oxide-lithium composite in which the surface thereof is coated with carbon at a coating amount of 5 to 50 mass % with respect to an amount of the whole composite particles after surface treatment.

It describes a method for manufacturing this composite, the method in which silicon oxide is a lithium dopant and lithium metal and/or an organolithium compound is used to dope with lithium at a temperature of 1300° C. or less, and further a method in which a silicon-silicon oxide-lithium composite that is pulverized into a predetermined particle size is subjected to heat CVD with an organic hydrocarbon gas and/or vapor at a temperature of 900 to 1400° C. and a carbon coating is formed at a coating amount of 5 to 50 mass % with respect to an amount of the whole composite particles after surface treatment.

CITATION LIST

Patent Literature

Patent Literature 1: Japanese Patent No. 2997741
Patent Literature 2: Japanese Unexamined Patent publication (Kokai) No. 8-102331
Patent Literature 3: Japanese Unexamined Patent publication (Kokai) No. 8-130011
Patent Literature 4: Japanese Unexamined Patent publication (Kokai) No. 8-130036
Patent Literature 5: Japanese Unexamined Patent publication (Kokai) No. 2003-160328
Patent Literature 6: Japanese Unexamined Patent publication (Kokai) No. 2002-42806
Patent Literature 7: Japanese Patent No. 3952180
Patent Literature 8: Japanese Unexamined Patent publication (Kokai) No. 2007-294423

SUMMARY OF THE INVENTION

As described above, the silicon oxide negative electrode material has been improved. However, even the most advanced art described in Patent Literature 8 is still insufficient for practical use.

That is, the conductive silicon-silicon oxide-lithium composite manufactured by the method described in Patent Literature 8 has consequently achieved extensive improvement in terms of the first efficiency but the cycle durability thereof is inferior in comparison with a conductive silicon-silicon oxide composite that is not doped with lithium.

The present invention was accomplished in view of the aforementioned problems, and it is an object of the present invention to provide a silicon oxide-based negative electrode material for a secondary battery with a non-aqueous electrolyte, having superior first efficiency and cycle durability to a conventional negative electrode material, a method for manufacturing the same, and a lithium ion secondary battery using the same.

In order to accomplish the above object, the present invention provides a negative electrode material for a secondary battery with a non-aqueous electrolyte including at least a silicon-silicon oxide composite and a carbon coating formed on a surface of the silicon-silicon oxide composite, wherein at least the silicon-silicon oxide composite is doped with lithium, and a ratio I(SiC)/I(Si) of a peak intensity I(SiC) attributable to SiC of 2θ=35.8±0.2° to a peak intensity I(Si) attributable to Si of 2θ=28.4±0.2° satisfies a relation of I(SiC)/I(Si)≤0.03, when x-ray diffraction using Cu-Kα ray.

In this manner, the negative electrode material for a secondary battery with a non-aqueous electrolyte, wherein, in the silicon-silicon oxide composite that is doped with lithium and has the carbon coating formed thereon, the ratio I(SiC)/I(Si) of the peak intensity I(SiC) attributable to SiC of 2θ=35.8±0.2° to the peak intensity I(Si) attributable to Si of 2θ=28.4±0.2° satisfies the relation of I(SiC)/I(Si)≤0.03, when x-ray diffraction using Cu-Kα ray, can have a sufficiently low amount of SiC at an interface between the silicon-silicon oxide composite and the carbon coating, and thereby has good electronic conductivity and discharge capacity, and particularly good cycle durability when used for a negative electrode material. In addition, since the negative electrode material is based on the silicon-silicon oxide composite that is doped with lithium and has the carbon coating formed thereon, it has higher capacity and superior in, particularly, the first efficiency as compared with a conventional negative electrode material.

In this case, a peak attributable to lithium aluminate can be further observed in the negative electrode material for a secondary battery with a non-aqueous electrolyte, when the x-ray diffraction using Cu-Kα ray.

The above-described negative electrode material containing aluminum can also has a sufficiently low amount of SiC at the interface between the silicon-silicon oxide composite and the carbon coating, and thereby is superior in, particularly, the cycle durability and the first efficiency. As described later, lithium aluminum hydride containing aluminum is preferably used for doping with lithium.

Furthermore, the present invention provides a lithium ion secondary battery having at least a positive electrode, a negative electrode, and a non-aqueous electrolyte having lithium ion conductivity, wherein the negative electrode material for a secondary battery with a non-aqueous electrolyte described in the present invention is used for the negative electrode.

As described above, the negative electrode material for a secondary battery with a non-aqueous electrolyte according to the present invention enables good battery characteristics (the first efficiency and the cycle durability) when used for a negative electrode of a non-aqueous electrolyte secondary battery. The lithium ion secondary battery in which the negative electrode material for a secondary battery with a non-aqueous electrolyte according to the present invention is used is therefore superior in the battery characteristics, particularly, the first efficiency and the cycle durability.

Furthermore, the present invention provides a method for manufacturing a negative electrode material for a secondary battery with a non-aqueous electrolyte including at least coating a surface of powder composed of at least one of silicon oxide and a silicon-silicon oxide composite with carbon by heat CVD treatment, blending a lithium dopant with the powder coated with carbon, and thereafter heating the powder coated with carbon to be doped with lithium.

In the case of coating with carbon by the heat CVD treatment after doping with lithium, silicon and carbon at the interface between the silicon-silicon oxide composite and the carbon coating react to accelerate generation of SiC due to the doping lithium, crystallization of silicon contained in the silicon-silicon oxide composite is accelerated, and thereby the electronic conductivity and cycle durability of the negative electrode material to be obtained in this case are not good. On the other hand, doping with lithium after the coating of carbon as described above enables a sufficiently low amount of the generation of SiC at the interface between the silicon-silicon oxide composite and the carbon coating. In addition to this, it can be suppressed to excessively grow silicon crystal contained in the silicon-silicon oxide composite, and the negative electrode material can be manufactured, the material which enables good battery characteristics, such as cycle durability, when used for a negative electrode.

Moreover, when the silicon-silicon oxide composite is coated with carbon and doped with lithium, the capacity thereof can be improved in comparison with conventional methods, and the negative electrode material for a secondary battery with a non-aqueous electrolyte can be manufactured which has improved conductivity and first efficiency.

In this case, lithium hydride and/or lithium aluminum hydride is preferably used as the lithium dopant.

In this manner, when lithium hydride and/or lithium aluminum hydride is used as the lithium dopant, the reaction is milder in comparison with the case of using lithium metal as the lithium dopant, and it can be doped with lithium with readily controlling the temperature. In addition, silicon oxide can be more reduced in comparison with the case of using a dopant containing oxygen, such as lithium hydroxide and lithium oxide, the negative electrode material having high discharge capacity can be thereby manufactured, and it can be a method for manufacturing a high capacity negative electrode material suitable to industrial mass production.

Moreover, the doping with lithium is preferably performed at a temperature equal to or lower than the temperature of the heat CVD treatment.

In this manner, when the doping with lithium is performed at a temperature equal to or lower than the temperature of the heat CVD treatment for coating with carbon, the acceleration of the generation of SiC and of the crystallization of silicon at the interface between the silicon-silicon oxide composite and the carbon coating can be surely suppressed, and the negative electrode material superior in battery characteristics can be manufactured.

Moreover, the temperature of the doping with lithium is preferably 800° C. or less.

In this manner, when it is heated at a temperature of 800° C. or less to be doped with lithium, SiC can be prevented from being generated, the silicon crystal contained in the silicon-silicon oxide composite can be prevented from excessively growing, the discharge capacity and the cycle durability can be surely prevented from deteriorating, and the negative electrode material for a secondary battery with a non-aqueous electrolyte having high capacity and high cycle durability can be manufactured.

Moreover, the temperature of the heat CVD treatment is preferably 800° C. or more.

In this manner, when the temperature of the heat CVD treatment is 800° C. or more, crystallization of carbon contained in the carbon coating and bonding of the carbon coating and the silicon-silicon oxide composite can be promoted, a high quality and fine carbon coating can be formed with high productivity, and the negative electrode material for a secondary battery with a non-aqueous electrolyte can be manufactured which has higher capacity and is superior in the cycle durability.

As explained above, the present invention provides the silicon oxide-based negative electrode material for a secondary battery with a non-aqueous electrolyte, having superior first efficiency and cycle durability to a conventional negative electrode material, the method for manufacturing the same, and the lithium ion secondary battery using the same.

DETAILED DESCRIPTION OF THE PREFERRED EMBODIMENTS

Figure 1:
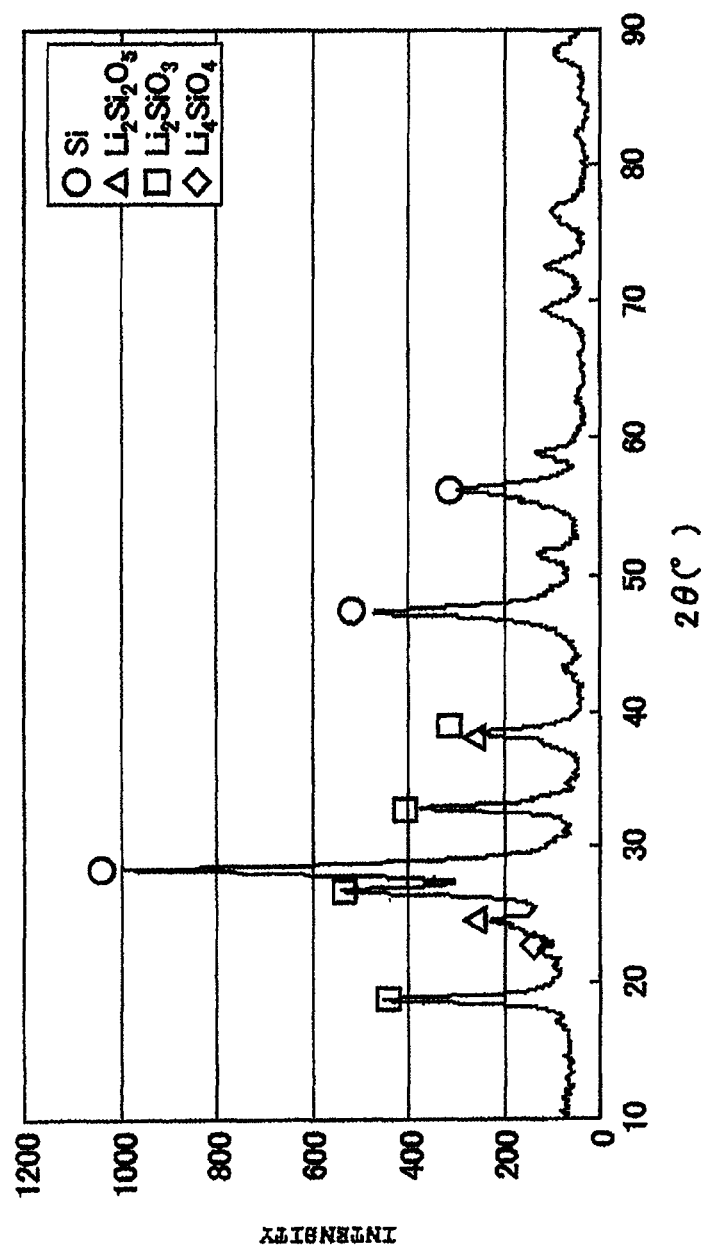
FIG. 1 is a view showing an x-ray diffraction chart of the negative electrode material for a secondary battery with a non-aqueous electrolyte in Example 1.

Hereinafter, the present invention will be explained in more detail.

In order to achieve the above object, the present inventor has repeatedly keenly conducted studies on the problem of a conventional negative electrode material for a secondary battery with a non-aqueous electrolyte and on the solution thereof.

The present inventor has thoroughly inspected the problem of the art described in Patent Literature 8, which is the most advanced art, among them and discovered the cause of inferior electronic conductivity and cycle durability.

That is, the present inventor has found that in the conductive silicon-silicon oxide-lithium composite manufactured by the method disclosed in Patent Literature 8, the carbon coating is apt to change into SiC and silicon is apt to crystallize when CVD treatment with high heat is performed after doping with lithium, and that this is caused by the doping with lithium.

The mechanism is not quite clear. It can be, however, considered that a part of silicon oxide is reduced by lithium and becomes silicon during the doping with lithium by using lithium metal and/or an organolithium compound, this silicon is apt to change into SiC and to crystallize as compared with silicon generated by the disproportionation, and causes deterioration of the battery characteristics, particularly, the cycle durability and the discharge capacity, when used for a negative electrolyte.

The present inventor further has repeatedly keenly conducted studies based on the above result of the studies, and consequently found that the doping with lithium after coating with carbon, the surface of the silicon oxide or the silicon-silicon oxide composite that is constituted by silicon particles being dispersed to silicon oxide enables doping with lithium while suppressing progress of the crystallization of silicon and the change into SiC, and that use of this silicon-silicon oxide composite, as a negative electrode active material of the secondary battery with a non-aqueous electrolyte, such as the lithium ion secondary battery, enables the secondary battery with a non-aqueous electrolyte having higher capacity, higher first efficiency, and superior cycle durability in comparison with conventional ones to be obtained. The present inventor thereby brought the present invention to completion.

Hereinafter, the present invention will be explained in detail with reference to the drawings. However, the present invention is not restricted thereto.

The negative electrode material for a secondary battery with a non-aqueous electrolyte according to the present invention comprises at least the silicon-silicon oxide composite and the carbon coating formed on the surface of the silicon-silicon oxide composite.

In this negative electrode material, at least the silicon-silicon oxide composite is doped with lithium, and the ratio I(SiC)/I(Si) of the peak intensity I(SiC) attributable to SiC of $2\theta=35.8\pm0.2°$ to the peak intensity I(Si) attributable to Si of $2\theta=28.4\pm0.2°$ satisfies the relation of I(SiC)/I(Si)$\leq$0.03, in the result of x-ray diffraction using Cu-K$\alpha$ ray.

For example, it is a conductive silicon-silicon oxide-lithium composite having the carbon coating formed thereon. The negative electrode material is composed of a silicon-silicon oxide composite that has a fine structure that silicon particles are dispersed to silicon oxide and/or lithium silicate in an atomic order and/or a crystallite state and has superior conductivity due to the carbon coating, superior first efficiency due to the doping with lithium, larger discharge capacity than conventional ones, and good cycle durability. It is to be noted that this dispersion structure can be observed by a transmission electron microscope.

Moreover, the ratio of the peak intensity I(SiC) attributable to SiC of $2\theta=35.8\pm0.2°$ to the peak intensity I(Si) attributable to Si of $2\theta=28.4\pm0.2°$ satisfies the relation of I(SiC)/I(Si)$\leq$0.03, when x-ray diffraction using Cu-K$\alpha$ ray.

This I(SiC)/I(Si) can be used as a criterion of the change of the carbon coating into SiC. In the case of I(SiC)/I(Si)>0.03, too many parts are changed into SiC in the carbon coating, and this may make a negative electrode material inferior in electronic conductivity and discharge capacity, because the generation of a large amount of SiC causes a decrease in the electronic conductivity of the interface and of the carbon coating, the capacity of the lithium ion secondary battery under high load consequently decreases, and particularly the cycle durability decreases. However, generating a very thin SiC layer at the interface between the carbon coating and the silicon-silicon oxide composite is useful for enhancing the adhesion strength of the coating.

The battery characteristics are therefore significantly deteriorated in the case of I(SiC)/I(Si)>0.03, whereas it is sufficiently permissible to be the amount of generated SiC under a condition of satisfying the relation of I(SiC)/I(Si)$\leq$0.03, when x-ray diffraction using Cu-K$\alpha$ ray. The negative electrode material for a secondary battery with a non-aqueous electrolyte according to the present invention accordingly satisfies I(SiC)/I(Si)$\leq$0.03.

In this case, the peak attributable to lithium aluminate can be further observed in the negative electrode material for a secondary battery with a non-aqueous electrolyte according to the present invention, when the x-ray diffraction using Cu-K$\alpha$ ray. Moreover, the peak attributable to lithium silicate can be also observed in the negative electrode material.

Here, lithium silicate means compounds represented by a general formula of Li$_x$SiO$_y$ ($1\leq x\leq 4$, $2.5\leq y\leq 4$), and lithium aluminate means compounds represented by a general formula of Li$_x$AlO$_y$ ($0.2\leq x\leq 1$, $1.6\leq y\leq 2$).

That is, the doping lithium can exist mainly in a state of lithium silicate and/or lithium aluminate in the negative electrode material for a secondary battery with a non-aqueous electrolyte, and thereby lithium stably exists in the silicon-silicon oxide composite.

The negative electrode material according to the present invention can be doped with lithium by using lithium aluminum hydride containing aluminum. This negative electrode material also has a sufficiently low amount of SiC at the interface between the silicon-silicon oxide composite and the carbon coating and is superior in the cycle durability and the first efficiency.

Next, the method for manufacturing a negative electrode material for a secondary battery with a non-aqueous electrolyte according to the present invention will be explained in detail, but the method is of course not restricted thereto.

First, powder is prepared which is composed of at least one of silicon oxide desirably being represented by a general formula of SiO$_x$ ($0.5\leq x\leq 1.6$), and the silicon-silicon oxide composite desirably having the structure that silicon particles are dispersed to silicon oxide in an atomic order and/or a crystallite state, the composite desirably having a Si/O molar ratio of 1/0.5 to 1/1.6.

It is to be noted that this powder can be pulverized and classified in a desired particle size distribution.

The powder is coated with carbon by the heat CVD treatment to give conductivity to the surface thereof.

It is to be noted that the time of the heat CVD treatment is appropriately set according to the relation of the carbon coating amount. In the event that the prepared powder contains silicon oxide, silicon oxide changes into a silicon-silicon oxide composite due to the influence of the treatment heat.

In the event that particles aggregate during the treatment, the aggregation can be disintegrated with a ball mill and the like. When the aggregation is disintegrated, the heat CVD treatment can be performed again by the same way as above.

Here, the temperature of the heat CVD treatment can be 800° C. or more.

For example, powder that is composed of at least one of silicon oxide and the silicon-silicon oxide composite can be subjected to carbon coating treatment by heating to a temperature of 800° C. or more and desirably 1300° C. or less (more desirably 900 to 1300° C., further 900 to 1200° C.), under an atmosphere containing at least an organic gas and/or vapor, by using a reactor that is heated at 800 to 1300° C. under inert gas flow.

As described above, when the temperature of the heat CVD treatment is 800° C. or more, sufficient fusion between the carbon coating and the silicon-silicon oxide composite, and sufficient alignment (crystallization) of carbon atom can be ensured. The negative electrode material for a secondary battery with a non-aqueous electrolyte that has higher capacity and is superior in the cycle durability can be therefore obtained. In addition, forming silicon crystallite does not take long time, and it is efficient.

At this point in time, the silicon-silicon oxide composite powder having the carbon coating formed thereon has not been doped with lithium yet, in the present invention. The formation of SiC is thereby suppressed even when the heat CVD treatment is performed at a high temperature of 800° C. or more, particularly, 900° C. or more.

Moreover, a lithium dopant is blended with the powder coated with carbon.

This blending is not restricted in particular as long as an apparatus that enables uniform blending under a dry atmosphere is used, and a tumbler mixer is exemplified as a small apparatus.

Specifically, a predetermined amount of the silicon-silicon oxide composite powder having the carbon coating formed thereon and of the lithium dopant is weighed out in a glove box under a dry air atmosphere to put into a stainless steel sealed container. They are rotated at room temperature for a predetermined time with them set to the tumbler mixer, and blended so as to be uniform.

Thereafter, the powder coated with carbon is heated to be doped with lithium.

Lithium hydride or lithium aluminum hydride can be used as the lithium dopant. When lithium hydride is used, the first efficiency is higher in comparison with the case of using lithium aluminum hydride having the same mass amount, and use of lithium hydride is thus better from the viewpoint of the battery characteristics. Moreover, lithium hydride may be used together with lithium aluminum hydride. Commercial lithium aluminum hydride as a reducing agent is circulated, and thus can be easily obtained.

In the case of using, for example, metallic lithium having high reactivity as the lithium dopant, the reactivity of lithiating agent is too high, and it is therefore necessary to perform the blending under an inert gas atmosphere, such as argon, in addition to under a dry atmosphere. On the other hand, in the case of using lithium hydride and/or lithium aluminum hydride, the blending can be performed under a dry atmosphere only, and is remarkably easy to handle.

Moreover, in the case of using metallic lithium and the like, a chain reaction occurs, and there is a high risk to create an ignited state. In the ignited state, there is a problem that a silicon crystal is excessively grown and the capacity and the cycle durability thereby decrease, in some cases. In case of lithium hydride and/or lithium aluminum hydride, the reaction proceeds slowly, and an increase in temperature due to reaction heat is several dozen degrees. The ignited state is not therefore created in this case, and the negative electrode material that has high capacity and is superior in the cycle durability can be readily manufactured in an industrial scale.

Moreover, in the case of using a dopant containing oxygen, such as lithium hydroxide and lithium oxide, there is a risk of a decrease in discharge capacity, which is caused by an insufficient reduction amount of silicon oxide of the manufactured negative electrode material. On the other hand, in case of lithium hydride and/or lithium aluminum hydride, such a risk can be surely avoided, and the negative electrode material having high capacity can be surely manufactured.

It is to be noted that when unreacted lithium hydride or lithium aluminum hydride is left behind, it is undesirable in both characteristic and safety aspects.

The lithiation reaction is solid-solid reaction between the silicon-silicon oxide composite having the carbon coating formed thereon and the lithium dopant. However, since the rate of diffusion of lithium into a solid is generally low, it is difficult for lithium to penetrate completely uniformly into the inside of the silicon-silicon oxide composite having the carbon coating formed thereon.

For safety sake, an additive amount of lithium is desirably equal to or less than an amount to supplement overall irreversible capacity (the difference between the charge capacity and the discharge capacity at the first charge/discharge), that is, $Li/O \leq 1$.

The doping with lithium can be performed at a temperature equal to or lower than the temperature of the heat CVD treatment.

When the lithiation reaction treatment is performed at a temperature equal to or lower than the temperature of the heat CVD treatment of the carbon coating, the generation of SiC at the interface between the silicon-silicon oxide composite and the carbon coating can be strongly suppressed, the generation which is accelerate due to heating at the lithiation, and the negative electrode material superior in the battery characteristics, particularly the cycle durability can be thereby obtained.

The temperature of the doping with lithium can be 800° C. or less.

When the doping with lithium is performed at a temperature of 800° C. or less, the silicon crystal contained in the silicon-silicon oxide composite can be prevented from excessively growing, and thereby the discharge capacity and the cycle durability can be surely prevented from deteriorating. That is, the negative electrode material for a secondary battery with a non-aqueous electrolyte that has high capacity and is superior in high cycle durability can be manufactured.

It is to be noted that temperature of the doping with lithium is desirably 200° C. or more from the viewpoint of reactivity.

A reactor having a heating mechanism is preferably used for the above-described lithiation reaction under an inert gas atmosphere, and the detail thereof is not restricted in particular.

For example, continuous or batch-wise treatment can be performed. Specifically, a rotary furnace, a vertical moving bed reactor, a tunnel furnace, a batch furnace, a rotary kiln, and the like may be selected, depending on a particular purpose. An electric tube furnace is exemplified as a small apparatus.

More specifically, the above-described blend is put into a quartz tube through which an argon gas flows, and heated with the electric tube furnace to react for a predetermined time.

In the event that the heat CVD treatment is performed after the powder composed of silicon oxide or the silicon-silicon oxide composite is doped with lithium, carbon reacts with silicon due to the influence of the doping lithium. The conductivity therefore decreases due to the generation of SiC, the cycle durability deteriorates due to excessive growth of the silicon crystal, and the battery characteristics thus deteriorate. However, in the case of doping with lithium at a low temperature after coating with carbon as the present invention, the generation amount of SiC at the interface between the silicon-silicon oxide composite and the carbon coating and the growth of the silicon crystal can be sufficiently suppressed, and the negative electrode material superior in the battery characteristics, such as the cycle durability, when used for a negative electrode can be obtained.

When the negative electrode material is used for a secondary battery with a non-aqueous electrolyte, the negative electrode material for a secondary battery with a non-aqueous electrolyte can be therefore obtained which has large discharge capacity and good cycle durability. In addition to this, low first efficiency, which is a fault of silicon oxide and the silicon-silicon oxide composite, is improved, in the negative electrode material.

The negative electrode material for a secondary battery with a non-aqueous electrolyte obtained according to the present invention as above can significantly contribute to the manufacture of an excellent non-aqueous electrolyte secondary battery that has high capacity and good first efficiency and is superior in the cycle performance, particularly a high performance lithium ion secondary battery, when used for the negative electrode active material of the non-aqueous electrolyte secondary battery.

In this case, the obtained lithium ion secondary battery is characterized by the use of the above-described negative electrode active material, while the materials of the positive electrode, the negative electrode, electrolyte, and separator, and the shape of the battery are not restricted.

For example, the positive electrode active material to be used may be transition metal oxides, such as $LiCoO_2$, $LiNiO_2$, $LiMn_2O_4$, $V_2O_5$, $MnO_2$, $TiS_2$, and $MOS_2$, and chalcogen compounds.

For example, the electrolyte to be used may be lithium salts, such as lithium perchlorate, in a non-aqueous solution form. A non-aqueous solvent to be used may be propylene carbonate, ethylene carbonate, dimethoxyethane, γ-butyrolactone and 2-methyltetrahydrofuran, alone or in admixture. Other various non-aqueous electrolytes and solid electrolytes can be used.

It is to be noted that when a negative electrode is fabricated by using the above-described negative electrode material for a secondary battery with a non-aqueous electrolyte, a conductive agent, such as graphite, can be added to the negative electrode active material.

In this case, the type of conductive agent is not restricted in particular, as long as it is an electronically conductive material that does not cause decomposition and alteration in the manufactured battery. Specifically, the usable conductive agent includes metals in powder or fiber form, such as Al, Ti, Fe, Ni, Cu, Zn, Ag, Sn and Si, natural graphite, synthetic graphite, various coke powders, meso-phase carbon, vapor phase grown carbon fibers, pitch base carbon fibers, PAN base carbon fibers, and graphite obtained by firing various resins.

With regard to an additive amount of the above-described conductive agent, the amount of the conductive agent contained in a blend of the negative electrode material for a secondary battery with a non-aqueous electrolyte according to the present invention and the conductive agent is desirably 1 to 60 mass % (more desirably 5 to 60 mass %, particularly 10 to 50 mass %, more particularly 20 to 50 mass %).

When the additive amount of the conductive agent is 1 mass % or more, a risk of not being able to withstand expansion and contraction associated with charge/discharge can be avoided. In addition, when it is 60 mass % or less, a risk of a decrease in charge/discharge capacity can be reduced as much as possible.

When a carbon-based conductive agent is used for the negative electrode, the total amount of carbon in the negative electrode active material is desirably 5 to 90 mass % (more desirably 25 to 90 mass %, particularly 30 to 50 mass %).

When the total amount is 5 mass % or more, it can withstand the expansion and contraction associated with charge/discharge. In addition, when the total amount is 90 mass % or less, the charge/discharge capacity does not decrease.

EXAMPLES

Hereinafter, the present invention will be explained in detail by showing Examples and Comparative Examples. However, the present invention is not restricted to Examples below.

It is to be noted that in Examples below, "%" indicate "mass %", and an average particle size is measured as a cumulative weight average value (or median diameter) $D_{50}$ upon measurement of particle size distribution by laser diffractometry. The size of silicon crystal is a size of a crystallite of Si (111) face obtained by the Scherrer method from data of the x-ray diffraction using Cu-Kα ray.

Example 1

Metallic silicon and silicon dioxide were blended at a molar ratio of 1:1, and reacted at 1400° C. under a reduced pressure of 100 Pa to generate a silicon oxide gas. The gas was cooled at 900° C. under a reduced pressure of 50 Pa to precipitate, and a product in mass form was consequently obtained. The product was pulverized with a dry-type ball mill to obtain powder having an average particle size of 5 μm.

Chemical analysis revealed that the composition of this powder was $SiO_{0.95}$, the structure that silicon particles were dispersed to silicon oxide in an atomic order and/or a crystallite state was observed with a transmission electron microscope, and the powder was thus silicon-silicon oxide composite. The size of silicon crystal of this silicon-silicon oxide composite was 4 nm.

The powder of the silicon-silicon oxide composite was subjected to the heat CVD treatment by using a raw material of a methane gas at 1100° C. under a reduced pressure of 1000 Pa for 5 hours to coat the surface of the powder with carbon. As a result, the carbon coating amount was 5% of the whole powder including the coating.

Next, 2.7 g powder of lithium hydride (reagent made by Wako Pure Chemical Industries, Ltd) was put into a porcelain mortar having an internal volume of 500 ml and pulverized in a glove box under a dry air atmosphere. Thereafter, 28.4 g silicon-silicon oxide composite powder having the carbon coating formed thereon was added thereto (lithium hydride:the silicon-silicon oxide composite (except carbon)=1:10 (a mass ratio)), and they were stirred and blended so as to be sufficiently uniform.

The blend of 29 g was transferred to a 70 ml alumina boat and the boat was carefully placed at the center of a furnace tube of an electric tube furnace provided with an alumina furnace tube having an inner diameter of 50 mm. It was heated up to 600° C. at 5° C. every minute while passing an argon gas at 2 liters every minute, and was cooled after holding of 1 hour.

The doping amount of lithium of the negative electrode material for a secondary battery with a non-aqueous electrolyte obtained as above was 8%. The structure that silicon particles were dispersed to silicon oxide in an atomic order and/or a crystallite state was observed with a transmission electron microscope.

Moreover, the peaks attributable to silicon and lithium silicate were observed when the x-ray diffraction using Cu-Kα ray. It was confirmed that the size of silicon crystal was 10 nm, and thus the growth of the silicon crystal was suppressed. It was further confirmed that the ratio of the peak intensity I(SiC) attributable to SiC of 2θ=35.8±0.2° to the peak intensity I(Si) attributable to Si of 2θ=28.4±0.2° satisfied a relation of I(SiC)/I(Si)=0, when x-ray diffraction using Cu-Kα ray, and thus the generation of SiC was suppressed. The x-ray diffraction chart thereof is shown in FIG. 1.

Example 2

Except that lithium aluminum hydride was used as the lithium dopant in Example 1, the negative electrode material for a secondary battery with a non-aqueous electrolyte was manufactured in the same conditions as Example 1, and the same evaluation was carried out.

As a result, the doping amount of lithium was 2%. The structure that silicon particles were dispersed to silicon oxide in an atomic order and/or a crystallite state was observed with a transmission electron microscope.

Figure 2:
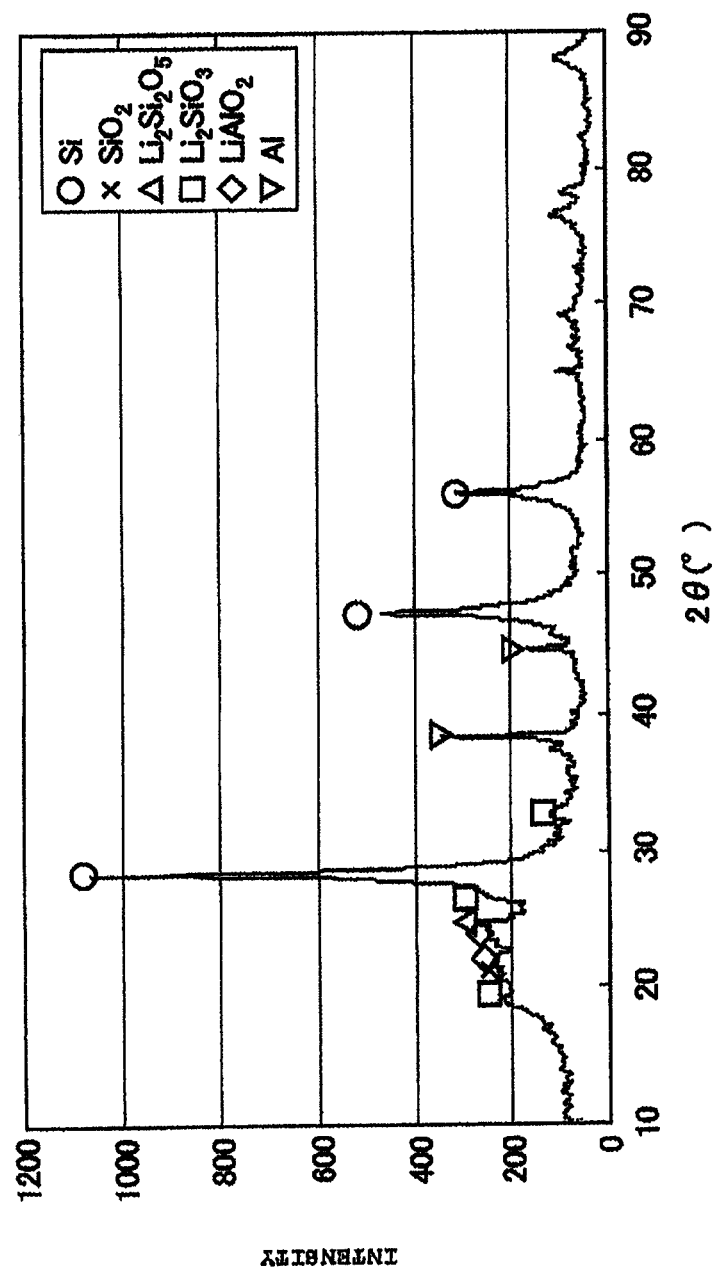
FIG. 2 is a view showing an x-ray diffraction chart of the negative electrode material for a secondary battery with a non-aqueous electrolyte in Example 2.

Moreover, it was confirmed that the peaks attributable to silicon, lithium silicate, and lithium aluminate were observed when the x-ray diffraction using Cu-Kα ray, the size of silicon crystal was 10 nm, and thus the growth of the silicon crystal was suppressed. It was further confirmed that the ratio satisfied a relation of I(SiC)/I(Si)=0, and thus the generation of SiC was suppressed. The x-ray diffraction chart thereof is shown in FIG. 2.

Example 3

Powder of a silicon-silicon oxide composite having a silicon crystal size of 4 nm was obtained by the same method as Example 1.

Except that the temperature of the heat CVD treatment was 1300° C. and the treatment time thereof was 1 hour, this powder of the silicon-silicon oxide composite was subjected to the heat CVD treatment in the same condition as Example 1, and the silicon-silicon oxide composite powder having the carbon coating formed thereon at a carbon coating amount of 5% was consequently obtained.

Next, the silicon-silicon oxide composite powder having the carbon coating formed thereon was reacted with lithium hydride in the same condition as Example 1.

The structure that silicon particles were dispersed to silicon oxide in an atomic order and/or a crystallite state was observed with a transmission electron microscope, in the negative electrode material for a secondary battery with a non-aqueous electrolyte obtained as above.

Moreover, it was confirmed that the peaks attributable to silicon and lithium silicate were observed when the x-ray diffraction using Cu-Kα ray, the size of silicon crystal was 28 nm, and thus the growth of the silicon crystal was suppressed. It was further confirmed that the ratio satisfied a relation of I(SiC)/I(Si)=0.026, and thus the generation of SiC was suppressed.

Example 4

Powder of a silicon-silicon oxide composite having a silicon crystal size of 4 nm was obtained by the same method as Example 1.

Except that the treatment time of the heat CVD treatment was 63 hours, this powder of the silicon-silicon oxide composite was subjected to the heat CVD treatment in the same condition as Example 1, and the silicon-silicon oxide composite powder having the carbon coating formed thereon at a carbon coating amount of 40% was consequently obtained.

Next, the silicon-silicon oxide composite powder having the carbon coating formed thereon was reacted with lithium hydride in the same condition as Example 1.

The structure that silicon particles were dispersed to silicon oxide in an atomic order and/or a crystallite state was observed with a transmission electron microscope, in the negative electrode material for a secondary battery with a non-aqueous electrolyte obtained as above.

Moreover, it was confirmed that the peaks attributable to silicon and lithium silicate were observed when the x-ray diffraction using Cu-Kα ray, the size of silicon crystal was 13 nm, and thus the growth of the silicon crystal was suppressed. It was further confirmed that the ratio satisfied a relation of I(SiC)/I(Si)=0.011, and thus the generation of SiC was suppressed.

Comparative Example 1

Powder of a silicon-silicon oxide composite having a silicon crystal size of 4 nm was obtained by the same method as Example 1.

This powder of the silicon-silicon oxide composite was subjected to the heat CVD treatment in the same condition as Example 1, and the silicon-silicon oxide composite powder having the carbon coating formed thereon at a carbon coating amount of 5% was consequently obtained. The size of silicon crystal of the powder was 7 nm.

The powder was used for a negative electrode material for a secondary battery with a non-aqueous electrolyte without doping with lithium.

Comparative Example 2

Except that, in Example 1, the order of a heat CVD process (at a temperature of 1100° C., for 5 hours) and a process of doping with lithium (use of lithium hydroxide, lithium hydroxide:the silicon-silicon oxide composite=1:10, a holing time of 1 hour at a temperature of 600° C.) was reversed, a negative electrode material for a secondary battery with a non-aqueous electrolyte was manufactured in the same condition as Example 1, and the same evaluation was carried out.

It was revealed that the size of silicon crystal was 37 nm from the result of the x-ray diffraction using Cu-Kα ray of the obtained negative electrode material for a secondary battery with a non-aqueous electrolyte, and thus the growth of silicon crystal was considerably accelerated due to lithium.

Figure 3:
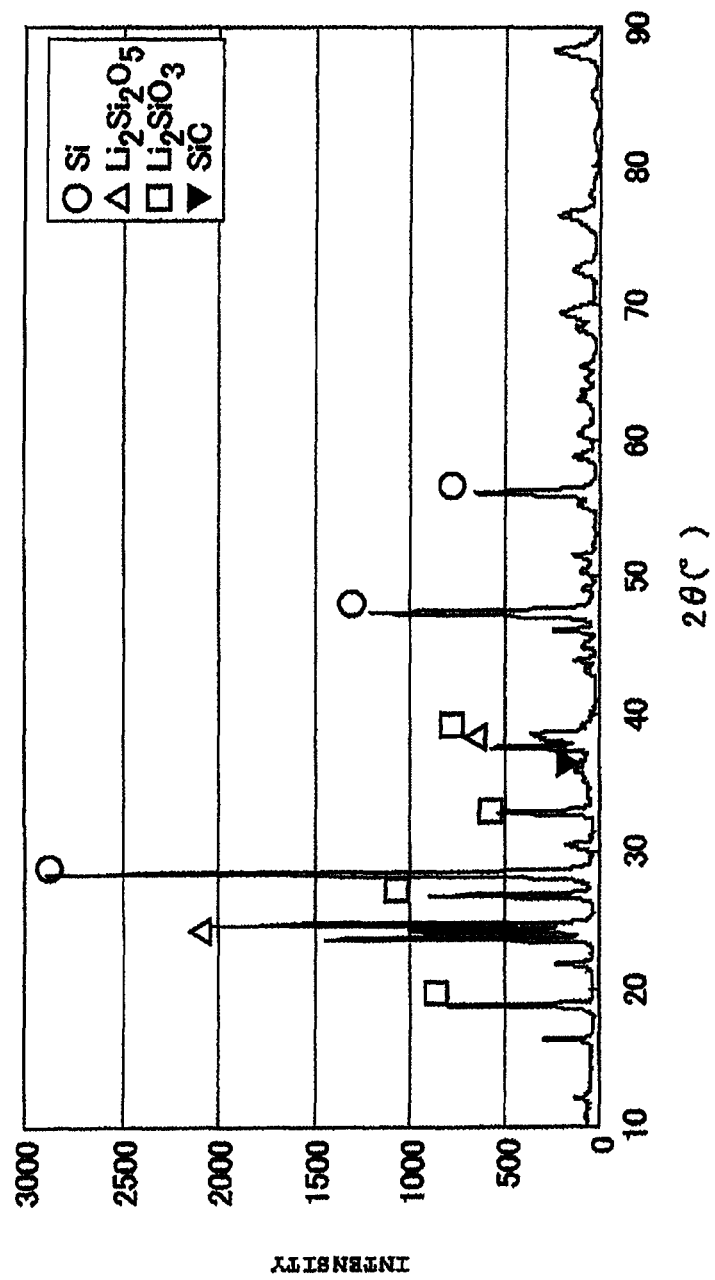
FIG. 3 is a view showing an x-ray diffraction chart of the negative electrode material for a secondary battery with a non-aqueous electrolyte in Comparative Example 2.

It was confirmed that the ratio satisfied a relation of I(SiC)/I(Si)=0.034, and thus SiC was largely generated. The x-ray diffraction chart thereof is shown in FIG. 3.

Comparative Example 3, 4, and 5

Except that, in Comparative Example 2, the temperature and the time of the heat CVD treatment process were 1300° C. and 1 hour (Comparative Example 3), 1300° C. and 10 hours (Comparative Example 4), 800° C. and 120 hours (Comparative Example 5), respectively, a negative electrode material for a secondary battery with a non-aqueous electrolyte was manufactured in the same condition as Comparative Example 2, and the same evaluation was carried out.

As a result, it was revealed that the sizes of silicon crystal were 45 nm (Comparative Example 3), 60 nm (Comparative Example 4), and 35 nm (Comparative Example 5), respectively, and thus the growth of silicon crystal was considerably accelerated due to lithium as with Comparative Example 2.

Moreover, it was confirmed that the ratio satisfied a relation of I(SiC)/I(Si)=0.041 (Comparative Example 3), I(SiC)/I(Si)=0.050 (Comparative Example 4), I(SiC)/I(Si)=0.034 (Comparative Example 5), respectively, and thus SiC was largely generated.

Comparative Example 6

Except for lithium hydroxide:the silicon-silicon oxide composite (except carbon)=1:2000 (a mass ratio) in Comparative Example 2, a negative electrode material for a secondary battery with a non-aqueous electrolyte was manufactured in the same condition as Comparative Example 2, and the same evaluation was carried out.

As a result, it was revealed that the size of silicon crystal was 34 nm, and the growth of silicon crystal was accelerated as with Comparative Example 2 to 5, despite a small doping amount of lithium.

Moreover, it was confirmed that the ratio satisfied a relation of I(SiC)/I(Si)=0.032, and thus SiC was largely generated.

(Battery Evaluation)

The evaluation as the negative electrode active material for a lithium ion secondary battery was carried out by the following method/procedure which was common to all Examples and Comparative Examples.

A blend was first produced by adding flake synthetic graphite powder (average particle diameter $D_{50}$=5 μm) to the obtained negative electrode material for a secondary battery with a non-aqueous electrolyte of 20 g in such amounts that the total of carbon in flake synthetic graphite and the carbon coating formed on the negative electrode material for a secondary battery with a non-aqueous electrolyte was 42%.

Binder KSC-4011 made by Shin-Etsu Chemical Co., Ltd. was added in an amount of 10% as solids to the blend to form a slurry at the temperature not exceeding 20° C. N-methylpyrrolidone was further added for viscosity adjustment. This slurry was speedily coated onto a copper foil having a thickness of 20 μm and dried at 120° C. for 1 hour. An electrode was thereafter formed by pressing with a roller press and finally punched out so as to have a size of 2 cm² as the negative electrode. At this point in time, the mass of the negative electrode was measured to calculate the mass of the negative electrode material by subtracting the mass of the copper foil, flake synthetic graphite powder, and the binder therefrom.

To evaluate the charge/discharge characteristics of the obtained negative electrode, a lithium-ion secondary battery for evaluation was fabricated using a lithium foil as a counter electrode; using, as a non-aqueous electrolyte, a non-aqueous electrolyte solution obtained by dissolving lithium hexafluorophosphate in a 1/1 (a volume ratio) mixture of ethylene carbonate and 1,2-dimethoxyethane at a concentration of 1 mol/L; and using a polyethylene microporous film having a thickness of 30 μm as a separator.

The fabricated lithium-ion secondary battery was allowed to stand overnight at room temperature. Thereafter, with a secondary battery charge/discharge test apparatus (made by Nagano, Co., Ltd.), the battery for evaluation was charged at a constant current of 1.5 mA until the test cell voltage reached 5 mV at room temperature. After the voltage reached 5 mV, the battery was charged at a reduced current so that the cell voltage was maintained at 5 mV. When the current value had decreased below 200 μA, the charging was terminated. The battery was discharged at a constant current of 0.6 mA, and the discharging was terminated when the cell voltage reached 2.0 V.

The charge/discharge capacity per unit mass of the negative electrode material was calculated by subtracting the charge/discharge capacity of the flake synthetic graphite powder from the above-obtained charge/discharge capacity.

capacity per mass (mAh/g)=discharge capacity of negative electrode material (mAh)/mass of negative electrode material (g)

first efficiency (%)=discharge capacity of negative electrode material (mAh)/charge capacity of negative electrode material (mAh)×100

The charge/discharge test of the lithium-ion secondary battery for evaluation was carried out 50 times by repeating the charge/discharge test as above, to evaluate the cycle durability.

capacity retention ratio (%)=discharge capacity of negative electrode material after 50 cycles (mAh)/first discharge capacity of negative electrode material (mAh)×100

Table 1 shows the result of evaluating the negative electrode material for a secondary battery with a non-aqueous electrolyte in Examples 1 to 4 and Comparative Examples 1 to 6 by the above-described method.

TABLE 1

| | CAPACITY PER MASS (mAh/g) | FIRST EFFICIENCY (%) | CAPACITY RETENTION RATIO (%) | RESULT |
|---|---|---|---|---|
| EXAMPLE 1 | 1370 | 85 | 89 | GOOD |
| EXAMPLE 2 | 1430 | 76 | 89 | GOOD |
| EXAMPLE 3 | 1400 | 86 | 81 | GOOD |
| EXAMPLE 4 | 870 | 85 | 93 | GOOD |
| COMPARATIVE EXAMPLE 1 | 1500 | 66 | 90 | LOW FIRST EFFICIENCY |
| COMPARATIVE EXAMPLE 2 | 1320 | 84 | 35 | INFERIOR CYCLE DURABILITY |
| COMPARATIVE EXAMPLE 3 | 1310 | 83 | 30 | INFERIOR CYCLE DURABILITY |
| COMPARATIVE EXAMPLE 4 | 1300 | 80 | 18 | INFERIOR CYCLE DURABILITY |
| COMPARATIVE EXAMPLE 5 | 1330 | 84 | 36 | INFERIOR CYCLE DURABILITY |
| COMPARATIVE EXAMPLE 6 | 1400 | 69 | 39 | INFERIOR CYCLE DURABILITY |

As shown in Table 1, it was revealed that the cases of the negative electrode materials in Examples 1 to 4, where the doping with lithium was performed after forming the carbon coating and a relation of $I(SiC)/I(Si) \leq 0.03$ was satisfied, showed a good value of each of the capacity per mass, the first efficiency, the capacity retention ratio after 50 cycles (cycle durability).

On the other hand, it was revealed that the case of Comparative Example 1, where the doping with lithium was not performed, showed inferior first efficiency, and that the cases of Comparative Examples 2 to 6, where the value of $I(SiC)/I(Si)$ exceeded 0.03, showed inferior cycle durability and a large amount of SiC generation, whereas the capacity per mass and the first efficiency had no problem, and thus had characteristic problems for the negative electrode material.

As described above, it is revealed that when the doping with lithium is performed after forming the carbon coating, the generation of SiC is suppressed so that the relation of $I(SiC)/I(Si) \leq 0.03$ is satisfied, even when the temperature of the heat CVD treatment is high and the doping amount of lithium is large, and the battery characteristics become good.

On the other hand, it is revealed that when the heat CVD treatment is performed after doping with lithium, SiC is largely generated so that the value of $I(SiC)/I(Si)$ exceeds 0.03, even when the temperature of the heat CVD treatment is low and the doping amount of lithium is small, and the battery characteristics do not become good.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A method for manufacturing a negative electrode material for a secondary battery with a non-aqueous electrolyte comprising the following steps in order:

coating a surface of powder comprised of at least one of silicon oxide and a silicon-silicon oxide composite with carbon by heat CVD treatment, blending a lithium dopant with the powder coated with carbon, and thereafter heating the powder coated with carbon to be doped with lithium.

2. The method for manufacturing a negative electrode material for a secondary battery with a non-aqueous electrolyte according to claim 1, wherein lithium hydride and/or lithium aluminum hydride is used as the lithium dopant.

3. The method for manufacturing a negative electrode material for a secondary battery with a non-aqueous electrolyte according to claim 2, wherein the doping with lithium is performed at a temperature equal to or lower than a temperature of the heat CVD treatment.

4. The method for manufacturing a negative electrode material for a secondary battery with a non-aqueous electrolyte according to claim 3, wherein the temperature of the doping with lithium is 800° C. or less.

5. The method for manufacturing a negative electrode material for a secondary battery with a non-aqueous electrolyte according to claim 4, wherein the temperature of the heat CVD treatment is 800° C. or more.

6. The method for manufacturing a negative electrode material for a secondary battery with a non-aqueous electrolyte according to claim 3, wherein the temperature of the heat CVD treatment is 800° C. or more.

7. The method for manufacturing a negative electrode material for a secondary battery with a non-aqueous electrolyte according to claim 2, wherein the temperature of the doping with lithium is 800° C. or less.

8. The method for manufacturing a negative electrode material for a secondary battery with a non-aqueous electrolyte according to claim 7, wherein the temperature of the heat CVD treatment is 800° C. or more.

9. The method for manufacturing a negative electrode material for a secondary battery with a non-aqueous electrolyte according to claim 2, wherein the temperature of the heat CVD treatment is 800° C. or more.

10. The method for manufacturing a negative electrode material for a secondary battery with a non-aqueous electrolyte according to claim 1, wherein the doping with lithium is performed at a temperature equal to or lower than a temperature of the heat CVD treatment.

11. The method for manufacturing a negative electrode material for a secondary battery with a non-aqueous electrolyte according to claim 10, wherein the temperature of the doping with lithium is 800° C. or less.

12. The method for manufacturing a negative electrode material for a secondary battery with a non-aqueous electrolyte according to claim 11, wherein the temperature of the heat CVD treatment is 800° C. or more.

13. The method for manufacturing a negative electrode material for a secondary battery with a non-aqueous electrolyte according to claim 10, wherein the temperature of the heat CVD treatment is 800° C. or more.

14. The method for manufacturing a negative electrode material for a secondary battery with a non-aqueous electrolyte according to claim 1, wherein the temperature of the doping with lithium is 800° C. or less.

15. The method for manufacturing a negative electrode material for a secondary battery with a non-aqueous electrolyte according to claim 14, wherein the temperature of the heat CVD treatment is 800° C. or more.

16. The method for manufacturing a negative electrode material for a secondary battery with a non-aqueous electrolyte according to claim 1, wherein the temperature of the heat CVD treatment is 800° C. or more.

* * * * *